United States Patent
Hayashida et al.

[19]

[11] Patent Number: 5,890,598
[45] Date of Patent: Apr. 6, 1999

[54] SUBSTRATE CASSETTE

[75] Inventors: Manabu Hayashida; Takanobu Fukudome, both of Tokyo, Japan

[73] Assignee: NEC Corporation, Tokyo, Japan

[21] Appl. No.: 8,323

[22] Filed: Jan. 20, 1998

[30] Foreign Application Priority Data

Jan. 22, 1997 [JP] Japan .................................. 9-009388

[51] Int. Cl.⁶ .................................................. B65D 85/30
[52] U.S. Cl. ........................... 206/710; 206/454; 206/711; 206/707
[58] Field of Search .................... 206/707, 711, 206/722, 454; 211/41.17, 41.18, 41.1

[56] References Cited

U.S. PATENT DOCUMENTS

| | | | |
|---|---|---|---|
| 3,682,083 | 8/1972 | Puente | 95/100 |
| 4,153,164 | 5/1979 | Hofmeister et al. | 211/41 |
| 4,155,447 | 5/1979 | Edwards | 206/334 |
| 4,724,963 | 2/1988 | Mortensen | 206/454 |
| 4,815,601 | 3/1989 | Peterson et al. | 206/454 |
| 4,872,554 | 10/1989 | Quernemoen | 206/454 |
| 4,930,634 | 6/1990 | Williams et al. | 206/454 |
| 5,377,825 | 1/1995 | Sykes et al. | 206/232 |
| 5,492,229 | 2/1996 | Tanaka et al. | 211/41 |
| 5,558,220 | 9/1996 | Gartz | 206/308.1 |
| 5,584,401 | 12/1996 | Yoshida | 211/41 |
| 5,638,958 | 6/1997 | Sanchez | 206/710 |

FOREIGN PATENT DOCUMENTS

| | | |
|---|---|---|
| 4-139741 | 5/1992 | Japan . |
| 5-147680 | 6/1993 | Japan . |
| 6-191547 | 7/1994 | Japan . |

*Primary Examiner*—Paul T. Sewell
*Assistant Examiner*—Trinh Nguyen
*Attorney, Agent, or Firm*—Young & Thompson

[57] ABSTRACT

A substrate cassette with a receiving frame having support plates formed integrally therewith. The support plates minimize the deformation of substrates loaded in the cassette and ascribable to their own weights. Hemispherical lugs are formed on each support plate in order to protect the rear of the substrates from scratches.

5 Claims, 4 Drawing Sheets

SUBSTRATE CASSETTE

BACKGROUND OF TH INVENTION

The present invention relates to a substrate cassette to be stored or transported with substrates loaded at spaced positions therein.

Various kinds of substrates including glass substrates for LCDs (Liquid Crystal Displays), plasma displays, hybrid ICs (Integrated Circuits) and thermal heads are extensively used. These kinds of substrates are loaded in a substrate cassette for storage or transport. The prerequisite with the substrate cassette is that substrates accommodated therein be prevented from contacting each other. To meet this requirement, it has been customary to form shelves facing each other on a pair of grooved side plates in the form of comb teeth. Each substrates each is inserted in the grooves of the side plates facing each other.

Japanese Patent Laid-Open Publication Nos. 5-147680 and 6-191547, for example, each discloses a box-like substrate cassette of the kind sustaining only opposite end faces of a substrate. This, however, brings about a problem that the substrate is dislocated horizontally or moved vertically during transport. When the substrate is moved horizontally or vertically, friction acts between the end faces of the substrate and the surfaces of the side plates and produces dust which causes troubles in circuitry formed on the substrate.

Today, there is an increasing demand for a thin, large size substrate configuration. Glass substrates, for example, having the conventional thickness of 1.1 mm and thicknesses as small as 0.7 mm to 0.5 mm are in use. As for size, glass substrates as broad as 400×500 mm or even 550×650 mm, which is approximately twice the conventional size of 370×470 mm, are available. Under these circumstances, the substrates are easy to deform and apt to break due to a fall during handling or due to contact with a robot hand.

Technologies relating to the present invention are also disclosed in, e.g., Japanese Patent Laid-Open Publication No. 4-139741.

SUMMARY OF THE INVENTION

It is therefore an object of the present invention to provide a substrate cassette capable of protecting glass substrates from scratches, minimizing the deformation of substrates despite their increasing size, and allowing substrates to be unloaded one by one with ease.

It is another object of the present invention to provide a substrate cassette minimizing the influence of vibration on substrates during transport.

A substrate cassette of the present invention includes a top frame and a bottom frame. A pair of grooved side plates face each other and support the top frame and bottom frame. Rib-like shelves protrude horizontally from the inner surfaces of the pair of side plates toward each other at a preselected pitch in the form of comb teeth for sustaining substrates. A pair of stops are affixed to the top frame and bottom frame for receiving the substrates loaded in the substrate cassette. A receiving frame intervenes between the pair of stops and has support plates positioned at the same pitch as the shelves and formed with hemispherical lugs on their upper surfaces. The hemispherical lugs make point-to-point contact with the substrates.

BRIEF DESCRIPTION OF THE DRAWINGS

The above and other objects, features and advantages of the present invention will become apparent from the following detailed description taken with the accompanying drawings in which.

Figure 1:
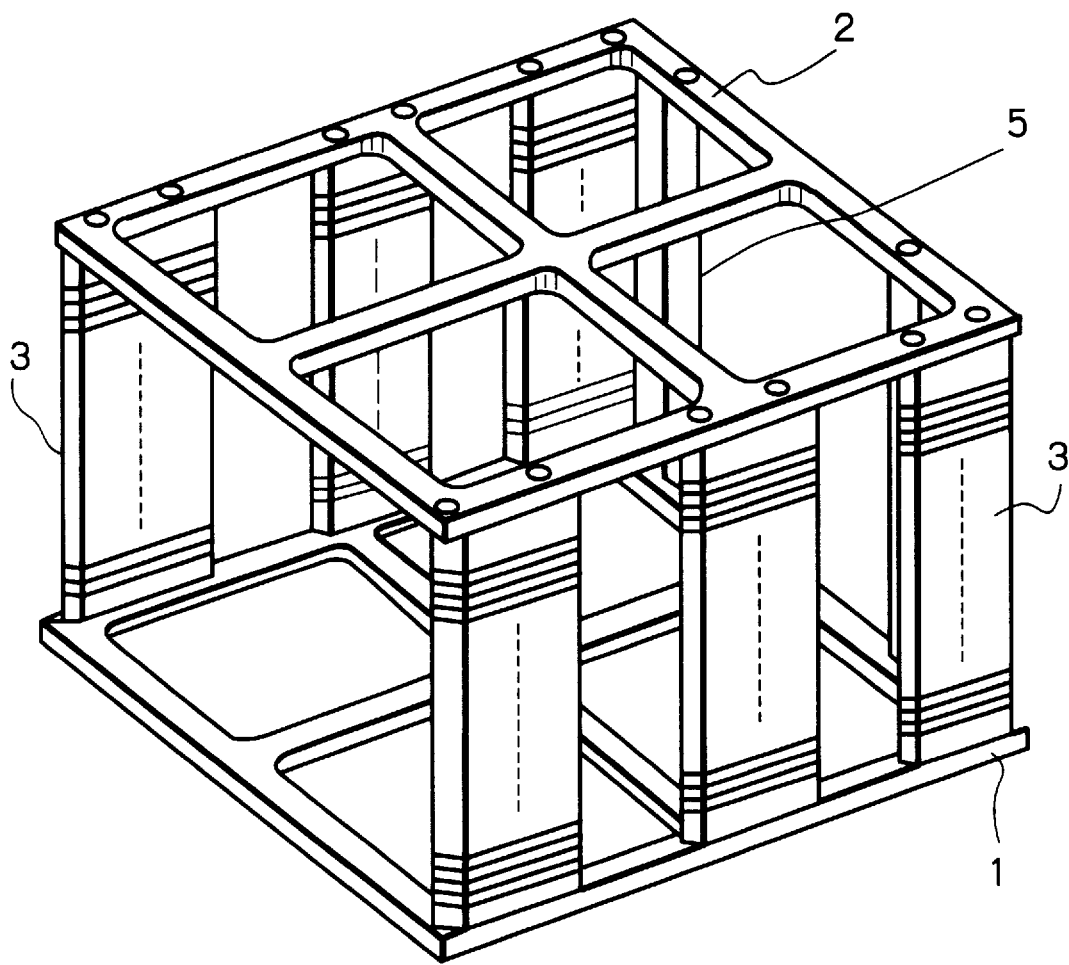
FIG. 1 is a perspective view showing a conventional substrate cassette.

In the drawings, identical references denote identical structural elements.

DESCRIPTION OF THE PREFERRED EMBODIMENT

To better understand the present invention, brief reference will be made to a conventional box-like substrate cassette, shown in FIG. 1. The substrate cassette to be described is taught in Japanese Patent Laid-Open Publication No. 5-147680 mentioned earlier. As shown, the cassette includes a bottom frame 1 and a top frame 2. Stops 5 for receiving substrates are affixed to the bottom frame 1 and top frame 2 at both ends thereof. Grooved side plates 3 form a pair of side walls facing each other. While three side plates 3 are showing as constituting one side wall, they may be replaced with two side plates or four side plates by way of example. The stops 5 are used to prevent substrates from slipping out of the cassette and may be replaced with plates identical with the side plates 3.

Usually, to insert substrates into the above cassette or pull them out of the cassette, the cassette is oriented such that its open end is positioned sideways. While the substrate loaded with substrates is transported, the open end of the cassette faces upward. During loading or unloading of substrates, a hand included in a handling robot enters the clearance between the bottom frame 1 and the lower ends of the side walls 3 and raises substrates. Alternatively, use may be made of a shuttle arm acting at the open end of the cassette, or a pusher or similar pushing means acting at the rear end of the cassette. Such automatic handling may even be replaced with manual handling.

Another conventional substrate cassette taught in, e.g., Japanese Patent Laid-Open Publication No. 6-191547 includes grooved side walls which hold substrates mechanically therebetween, relying on some force applied thereto from the outside.

The above conventional substrate cassette each has some problems left unsolved, as discussed earlier.

Figure 2:
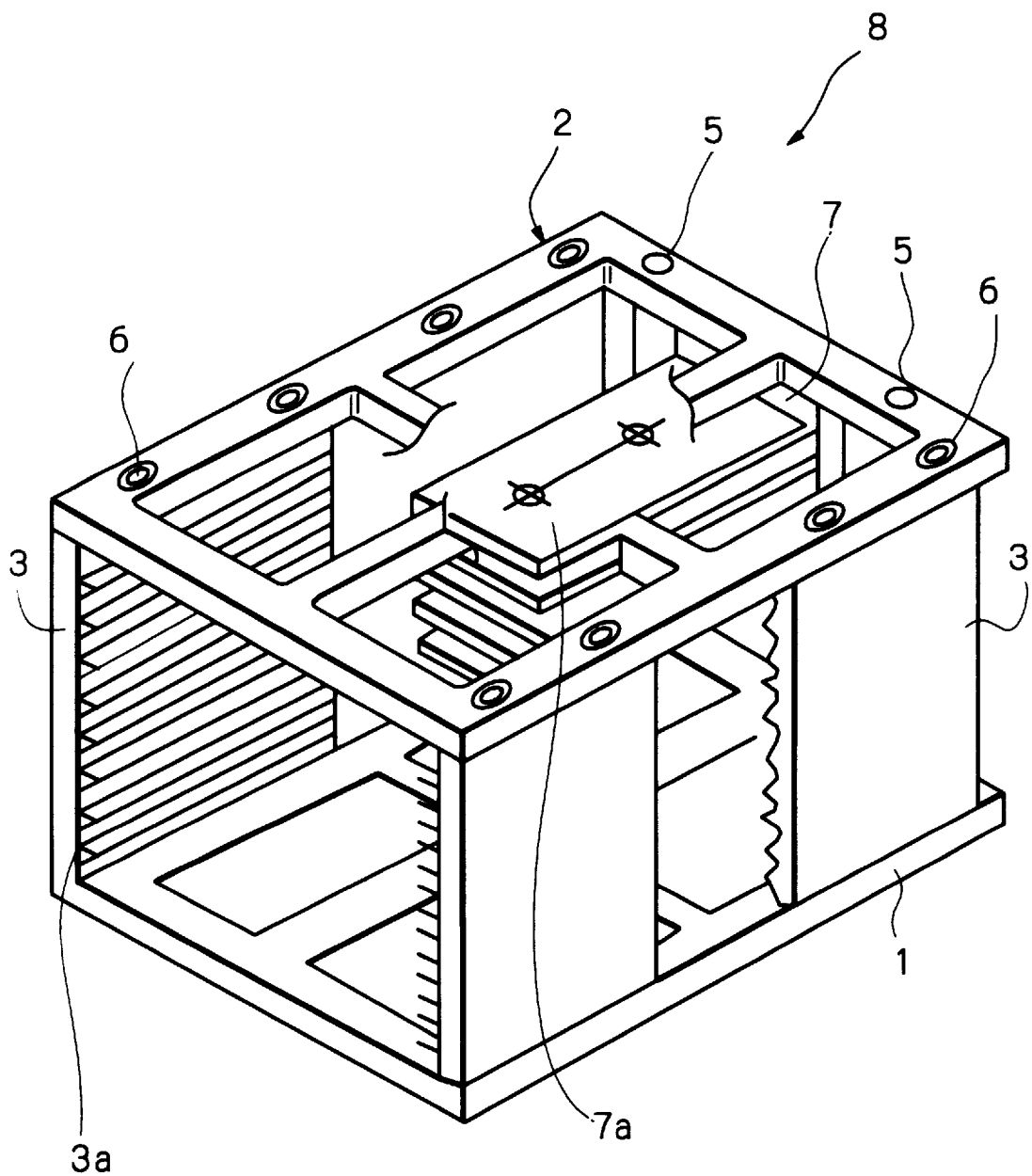
FIG. 2 is a perspective view showing a substrate cassette embodying the present invention.

Referring to FIGS. 2–6, a substrate cassette embodying the present invention will be described. As shown in FIG. 2, the substrate cassette, generally 8, includes a bottom frame 1 and a top frame 2 forming a substrate loading space therebetween. The top, frame 1 and bottom frame 2 and grooved side plates 3 facing each other, a pair of stops 5 and a receiving frame 7 are fastened together by screws 6. Shelves 3a are formed integrally with the individual side plate 3 by melt molding. The shelves 3a protrude toward each other from the inner surfaces of the side plates 3 at the same pitch in the form of comb teeth. Specifically, the shelves 3a each protrudes from the respective side plate 3 to a distance of about 10 mm to 15 mm. The shelves 3a facing each other support the rear of the longer edges of a substrate in point-to-point or line-to-line contact.

The stops 5 are implemented as round rods having no directionality. The receiving frame 7 faces the open end of the cassette via which substrates are loaded and unloaded. Support plates 7a are formed integrally with the frame 7 by melt molding in order to sustain the intermediate portions of substrates.

Figure 3:
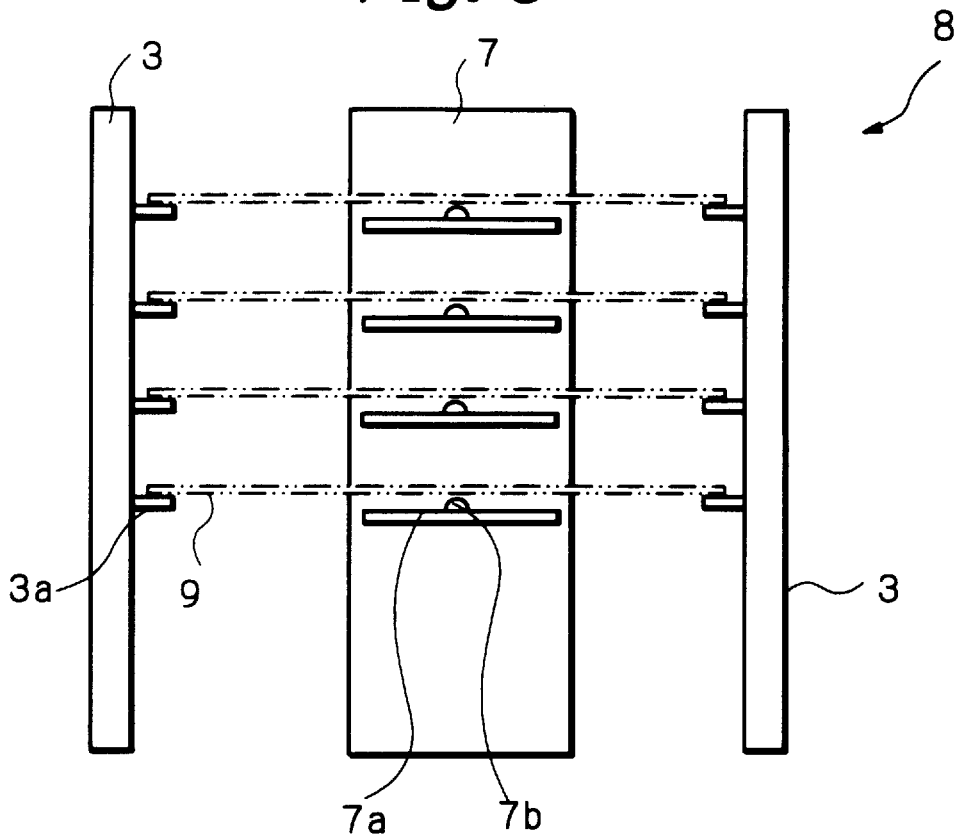
FIG. 3 is a front view of the illustrative embodiment.

As shown in FIG. 3, each of the support plates 7a is formed with a hemispherical lug 7b which contacts the rear of a substrate. To contact a portion of a substrate 9 as close to the center as possible, each support plate 7a is formed flat and implemented as an integral molding having metal at the inside and resin at the outside. With this configuration, the support plate 7a is provided with high rigidity. The substrates 9 to be loaded in the cassette 8 are flat. In light of this, the support plates 7a are arranged at the same pitch as the side plates 3, but positioned lower than the side plates 3 by about 2 mm to 5 mm, as measured from the bottom frame 1. This minimizes the spacing between the longer edges of each substrate 9 and the side plates 3.

Figure 4:
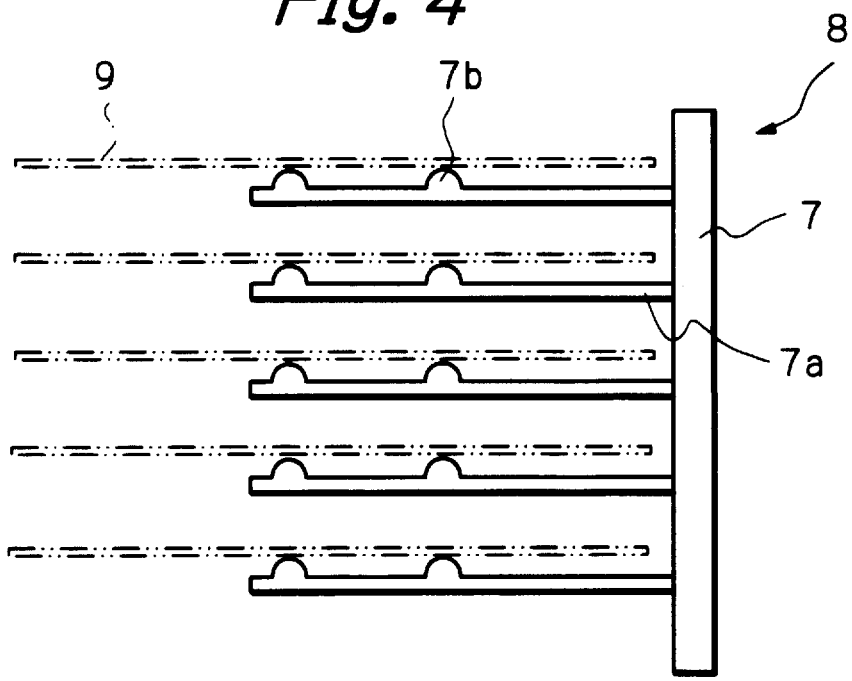
FIG. 4 is a fragmentary side elevation of the illustrative embodiment.
Figure 5:
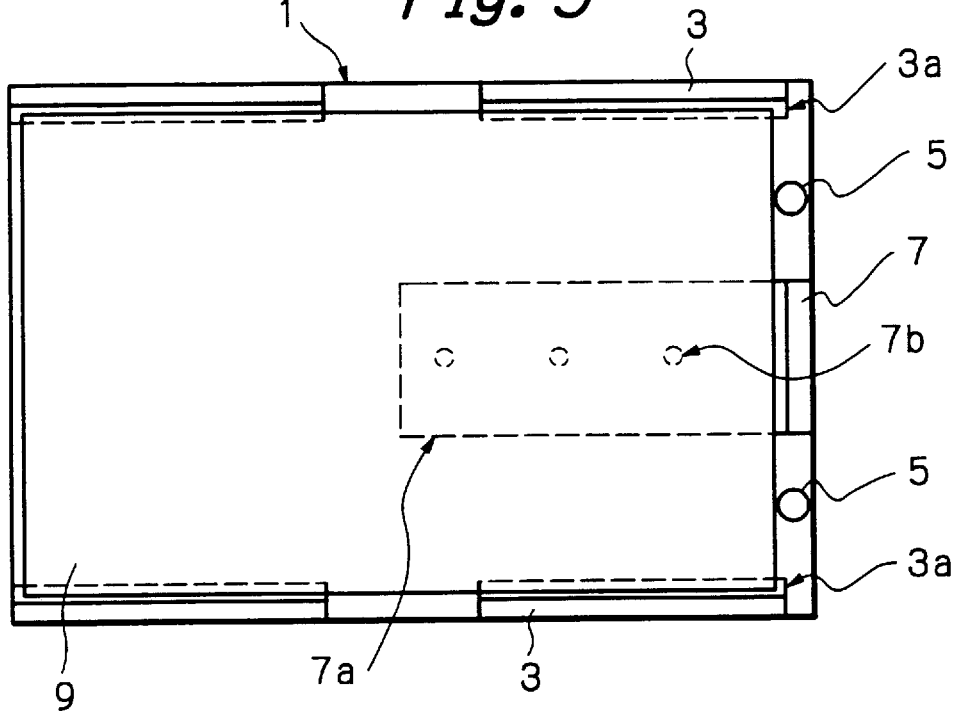
FIG. 5 is a fragmentary plan view of the illustrative embodiment.

More specifically, as shown in FIG. 4, a plurality of hemispherical lugs 7b are formed on each support plate 7a so as to contact the rear of the associated substrate 9. As shown in FIG. 5, the lugs 7b make point-to-point contact with the rear of the substrate 9 so as not to scratch it. The lugs 7b can be molded integrally with the support plate 7a. The bottom frame 1 and top frame 2 may advantageously be implemented by moldings of composite thermoplastic synthetic resin. Composite thermoplastic resin refers to polyether imide, polyetherether ketone or similar thermoplastic resin having required properties (strong and resistive to heat, solvent, acid and alkali), and containing conductive carbon fibers. During transport, friction occurs between the rear of the substrates 9 and the upper surfaces of the shelves 3a and lugs 7b and between the end faces of the substrates 9 and the side plates 3 directly contacting each other. Dust produced by to the friction would adversely effect circuitry formed on the substrates 9. It is therefore desirable to implement the above structural elements as integral moldings of polyetherether ketone or similar material having hardness and wear resistivity.

In the position shown in FIG. 2, the substrates 9 are sequentially conveyed into the open end of the cassette 8 by, e.g., a robot and positioned on the shelves 3a of the side plates 3 facing each other. At this instant, the support plates 7a and lugs 7b allow a minimum of deformation to occur in the substrates 9 due to their own weights. In addition, because the robot, for example, pulls out relatively flat ones of the substrates 9 from the cassette 8, stress to act on the substrates 9 in the vertical direction when the substrates 9 are lifted is reduced.

Figure 6:
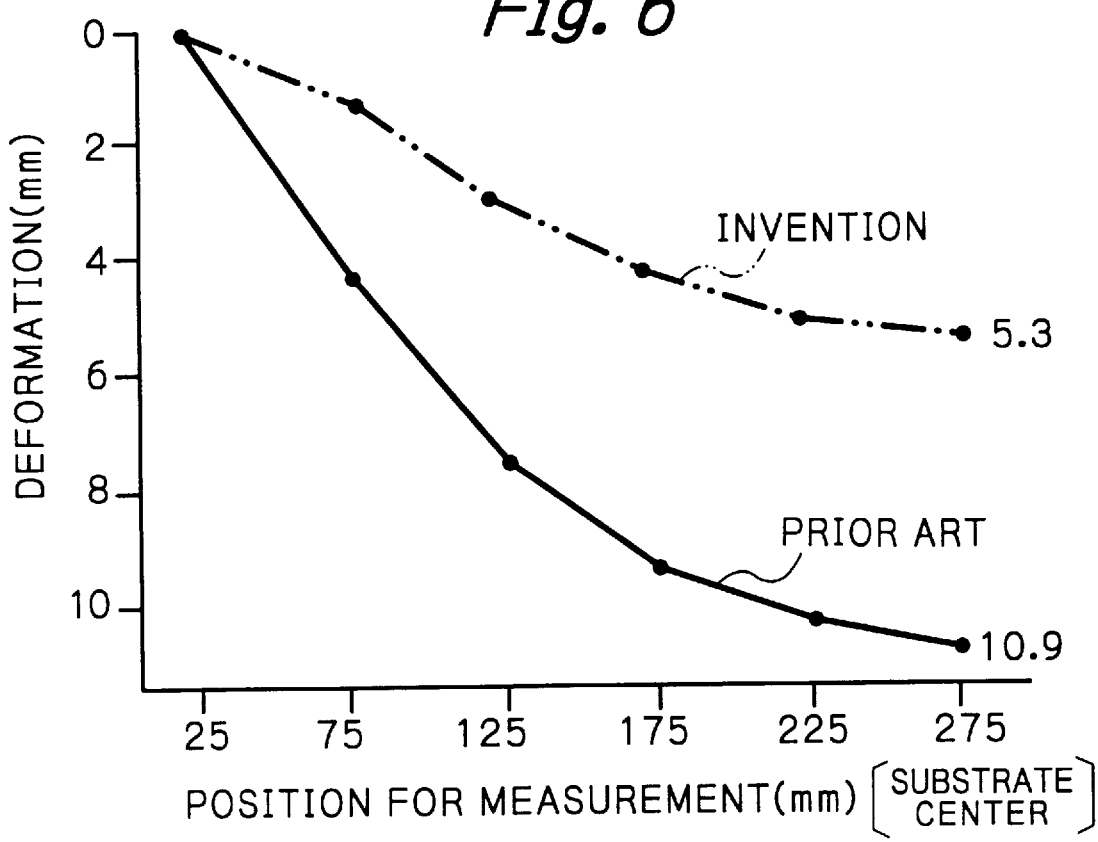
FIG. 6 is a graph comparing a conventional substrate frame and the illustrative embodiment with respect to the deformation of a substrate.

FIG. 6 is a graph comparing a conventional substrate cassette and the illustrative embodiment shown and described with respect to the deformation of a substrate ascribable to its own weight. This kind of deformation is critical when substrates whose size is increasing are handled by a robot. As FIG. 6 indicates, while the deformation with the conventional cassette is as great a 10.9 mm, as measured at the center of a substrate, the deformation with the illustrative embodiment is as small as 5.3 mm, as determined by experiments. The data shown in FIG. 6 were obtained with LCD glass substrates not in the vicinity of the shelves 3a, but in the vicinity of the open end of the cassette vial which the substrates were actually loaded and unloaded. In the vicinity of the shelves 3a, the deformation was measured to be 5 mm to 1.0 mm, i.e., the substrates were substantially horizontal.

In summary, it will be seen that the present invention provides a substrate cassette having various unprecedented advantages, as enumerated below.

(1) The cassette reduces the deformation of a substrate, as measured at its outlet, by about 50%, compared to a conventional substrate cassette.

(2) Even when conventional 1.1 mm thick substrates or even thinner substrates are handled by a robot, the above decrease in deformation makes it needless to provide the robot with two handling points. Specifically, because the deformation of a substrate is proportional to the square of a thickness, a decrease in thickness is apt to aggravate the deformation. The present invention successfully confines the deformation in a desirable range.

(3) It is not necessary to extend the size or pitch of the cassette complementarily to the deformation of a substrate increasing with a decrease in thickness. This is because the deformation can be confined in the desirable range without regard to the thickness of a substrate.

Various modifications will become possible for those skilled in the art after receiving the teachings of the present disclosure without departing from the scope thereof.

What is claimed is:

1. A substrate cassette for supporting substrates during storage and conveyance comprising:

a top frame;

a bottom frame;

a pair of grooved side plates facing each other and supporting said top frame and said bottom frame, said grooved side plates comprising inner surfaces and rib-like shelves protruding horizontally from said inner surfaces at a preselected pitch in a form of comb teeth for supporting the substrates along two opposing substrate side edges;

a pair of stops affixed to said top frame and said bottom frame for receiving the substrates loaded in said substrate cassette; and a receiving frame intervening between said pair of stops, said receiving frame comprising a support extending between said top frame and said bottom frame and plural support plates connected approximately orthogonal to said support, said plural support plates extending from said support and designed and adapted to provide support to the substrates at a point intermediate said rib-like shelves and remote from a substrate width edge by a distance of a least one-third a length of the substrates.

2. The substrate cassette of claim 1, wherein one of said support plates further comprises a lug extending upward from an upper surface of one of said support plates so that the substrate supported by the support plate is point-supported by said lug.

3. A substrate cassette as claimed in claim 2, wherein said support plates are formed integrally with said receiving frame by melt molding of resin.

4. The substrate cassette of claim 2, wherein said one of said support plates comprises two lugs extending upward from said upper surface and remote from a perimeter of said one of said support plates, said two lugs being positioned on said one of said support plates to provide support to the substrate being supported at two points intermediate said rib-like shelves and remote from the substrate width edge within a range of a distance of approximately one-third to approximately two-thirds the length of the substrate being supported so that the substrate being supported is supported at two opposing edges and at two points therebetween to provide adequate support against sagging deformation whilst avoiding the production of dust caused by friction between the substrate and the rib-like shelves and said two lugs.

5. A substrate cassette as claimed in claim 4, wherein said lugs of said support plates are formed of either one of resin and rubber.

* * * * *

UNITED STATES PATENT AND TRADEMARK OFFICE
CERTIFICATE OF CORRECTION

PATENT NO.   : 5,890,598
DATED        : April 6, 1999
INVENTOR(S)  : Manabu HAYASHIDA et al.

It is certified that error appears in the above-indentified patent and that said Letters Patent is hereby corrected as shown below:

On the cover page, in Item [56] References Cited, under "FOREIGN PATENT DOCUMENTS", insert:

--7-273059    10/1995    Japan--.

Signed and Sealed this

Tenth Day of August, 1999

*Attest:*

Q. TODD DICKINSON

*Attesting Officer*      Acting Commissioner of Patents and Trademarks